(12) United States Patent
Wang et al.

(10) Patent No.: US 8,207,037 B2
(45) Date of Patent: Jun. 26, 2012

(54) METHOD FOR MANUFACTURING A SEMICONDUCTOR COMPONENT THAT INCLUDES A FIELD PLATE

(75) Inventors: Hui Wang, East Greenwich, RI (US); Gennadiy Nemtsev, Stoughton, MA (US); Yingping Zheng, East Greenwich, RI (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 717 days.

(21) Appl. No.: 11/931,606

(22) Filed: Oct. 31, 2007

(65) Prior Publication Data

US 2009/0108342 A1 Apr. 30, 2009

(51) Int. Cl.
*H01L 21/8236* (2006.01)
(52) U.S. Cl. .................. 438/268; 438/270
(58) Field of Classification Search .......... 438/268–274, 438/E27.096, E27.055, E27.058
See application file for complete search history.

(56) References Cited

U.S. PATENT DOCUMENTS

| 5,998,833 A | 12/1999 | Baliga |
| 6,388,286 B1 | 5/2002 | Baliga |
| 6,621,121 B2 | 9/2003 | Baliga |
| 6,764,889 B2 | 7/2004 | Baliga |
| 6,818,946 B1 | 11/2004 | Venkatraman |
| 6,818,948 B2 * | 11/2004 | Lin .............................. 257/330 |
| 6,987,040 B2 | 1/2006 | Venkatraman |
| 7,009,237 B2 * | 3/2006 | Adkisson et al. ............. 257/301 |
| 2005/0001264 A1 * | 1/2005 | Ono et al. ..................... 257/330 |
| 2005/0242392 A1 | 11/2005 | Pattanayak |
| 2006/0273386 A1 | 12/2006 | Yilmaz |

* cited by examiner

*Primary Examiner* — Cuong Q Nguyen
(74) *Attorney, Agent, or Firm* — Renner William Dover

(57) ABSTRACT

A semiconductor component that includes a field plate and a semiconductor device and a method of manufacturing the semiconductor component. A semiconductor material includes an epitaxial layer disposed on a semiconductor substrate. A trench having an upper portion and a lower portion is formed in the epitaxial layer. A portion of a field plate is formed in the lower portion of the trench, wherein the field plate is electrically isolated from trench sidewalls. A gate structure is formed in the upper portion of the trench, wherein a gate oxide is formed from opposing sidewalls of the trench. Gate electrodes are formed adjacent to the gate oxide formed from the opposing sidewalls and a dielectric material is formed adjacent to the gate electrode. Another portion of the field plate is formed in the upper portion of the trench and cooperates with the portion of the field plate formed in the lower portion of the trench to form the field plate.

20 Claims, 8 Drawing Sheets

US 8,207,037 B2

1

METHOD FOR MANUFACTURING A SEMICONDUCTOR COMPONENT THAT INCLUDES A FIELD PLATE

TECHNICAL FIELD

The present invention relates, in general, to semiconductor components and, more particularly, to power switching semiconductor components.

BACKGROUND

Metal-Oxide Semiconductor Field Effect Transistors ("MOSFETs") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

Today's high voltage power switch market is driven by two major parameters: breakdown voltage ("BVdss") and on-state resistance ("Rdson"). For a specific application, a minimum breakdown voltage is required, and in practice, designers typically can meet a BVdss specification. However, this is often at the expense of Rdson. This trade-off in performance is a major design challenge for manufacturers and users of high voltage power switching devices. Another challenge arises because Power MOSFET devices have an inherent P-N diode between a P-type conductivity body region and an N-type conductivity epitaxial region. This inherent P-N diode turns on under certain operating conditions and stores charge across the P-N junction. When a sudden reverse bias is applied to the P-N diode, the stored charge produces a negative current flow until the charge is completely depleted. The time for the charge to become depleted is referred to as the reverse recovery time ("Trr") and delays the switching speed of the power MOSFET devices. In addition, the stored charge ("Qrr") also causes a loss in the switching voltage levels due to the peak reverse recovery current ("Irr") and the reverse recovery time.

Accordingly, it would be advantageous to have a semiconductor component that has a lower Rdson with a higher breakdown voltage and lower switching losses, i.e., lower Qrr losses, and a method for manufacturing the semiconductor component. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference numbers designate like elements and in which.

2

Figure 2:
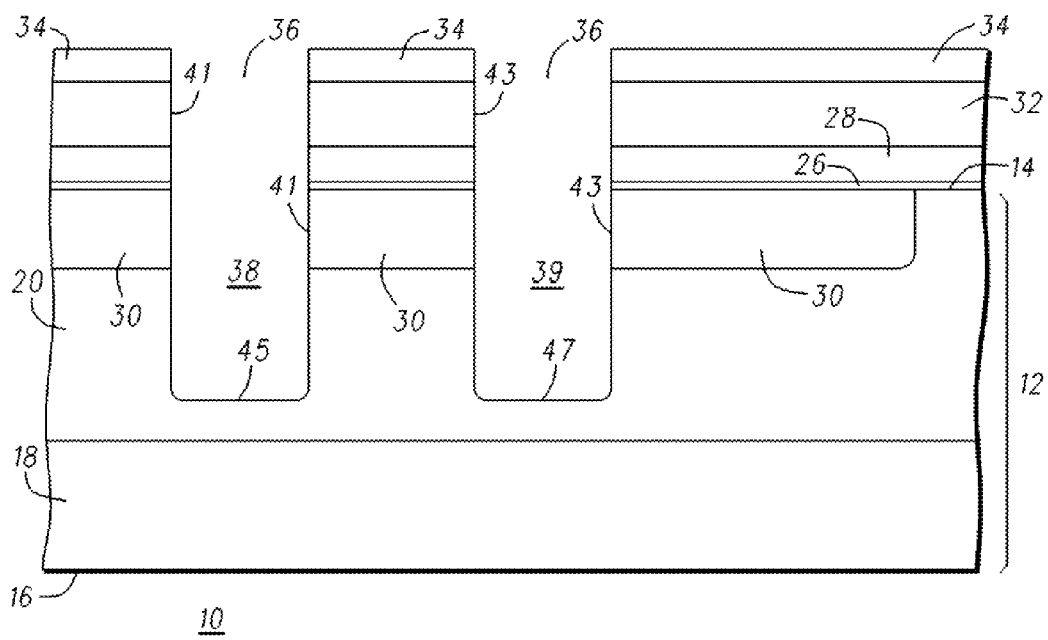
FIG. 2 is a cross-sectional view of the semiconductor component of FIG. 1 at a later stage of manufacture.
Figure 3:
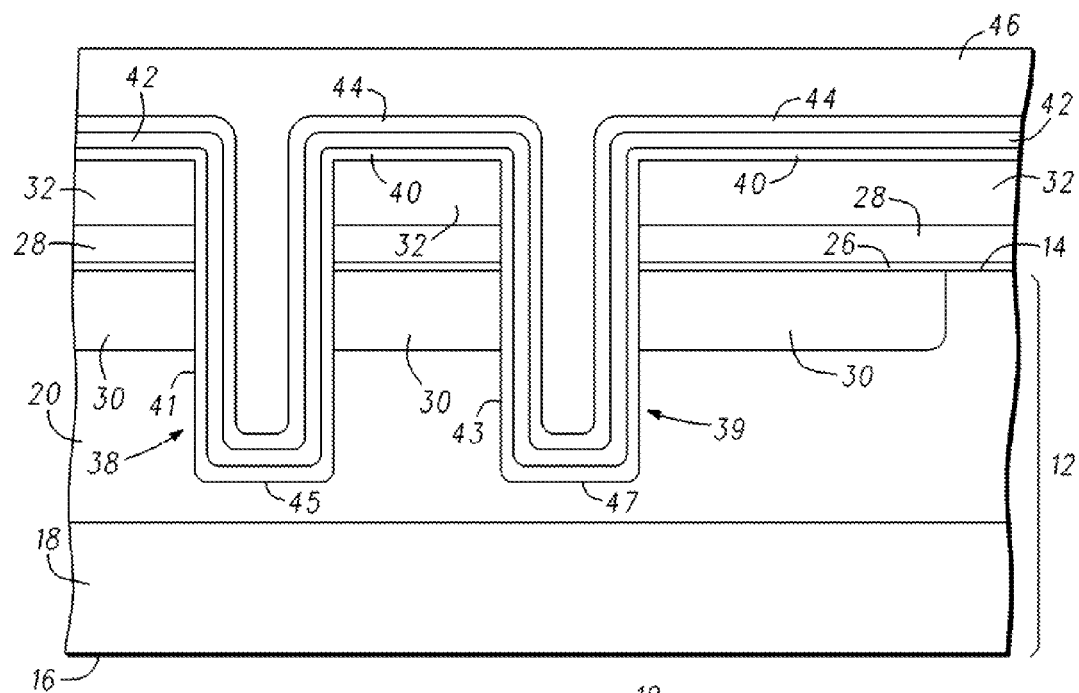
Figure 4:
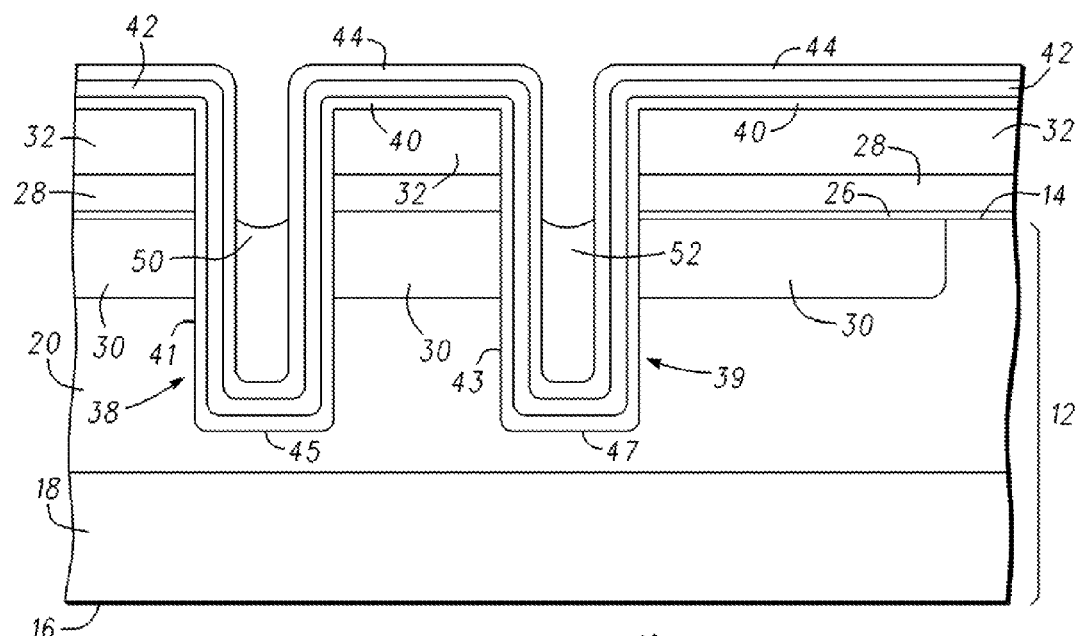
Figure 5:
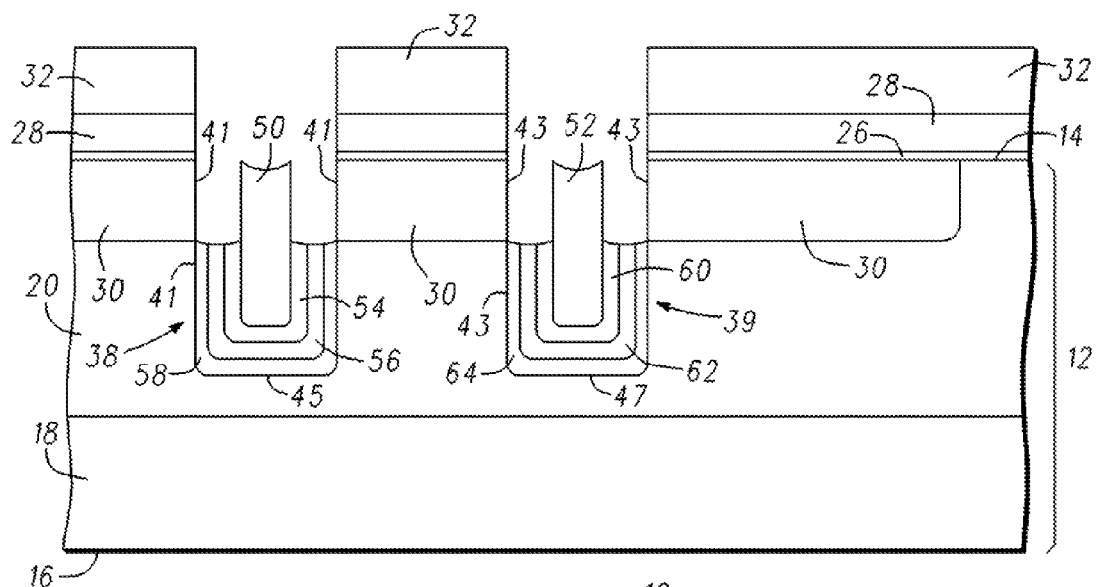
Figure 6:
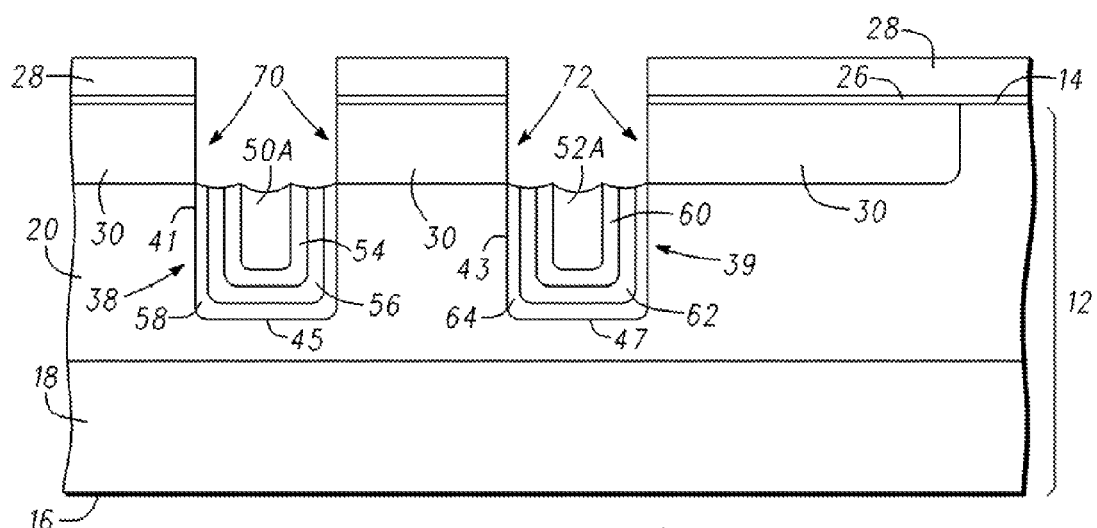
Figure 7:
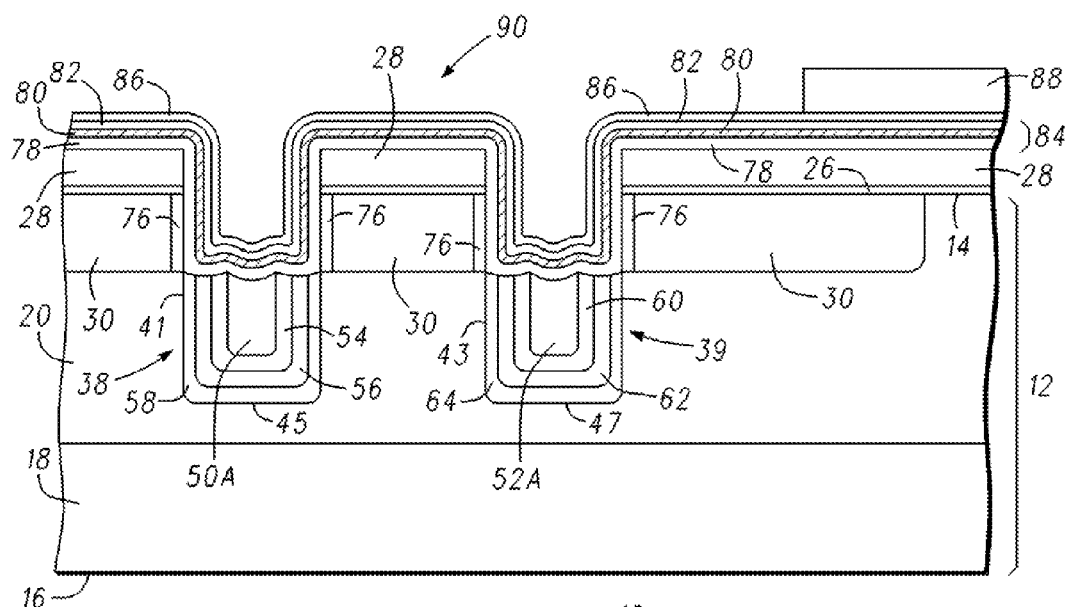
Figure 8:
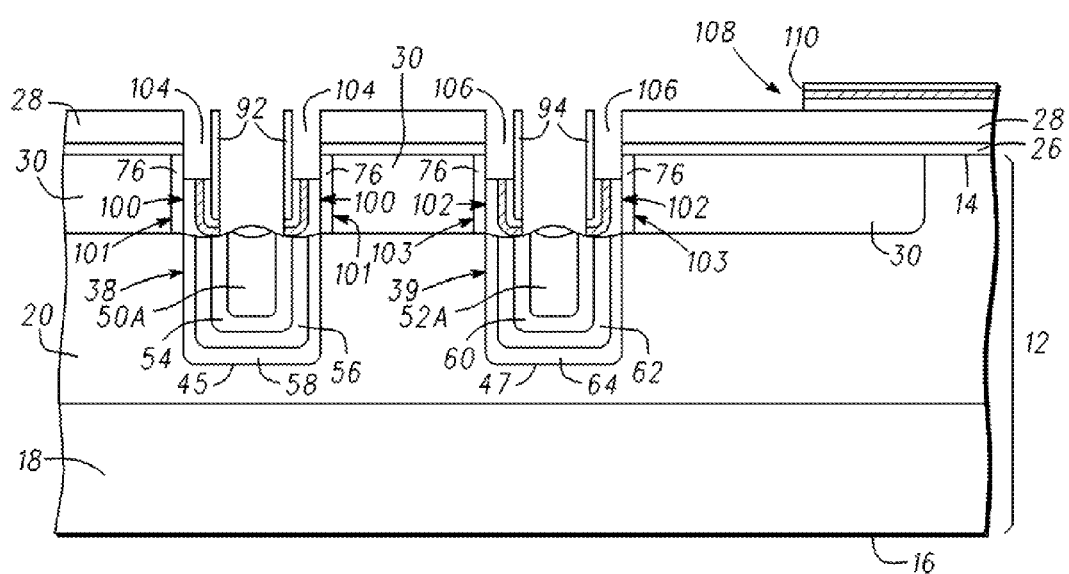
Figure 9:
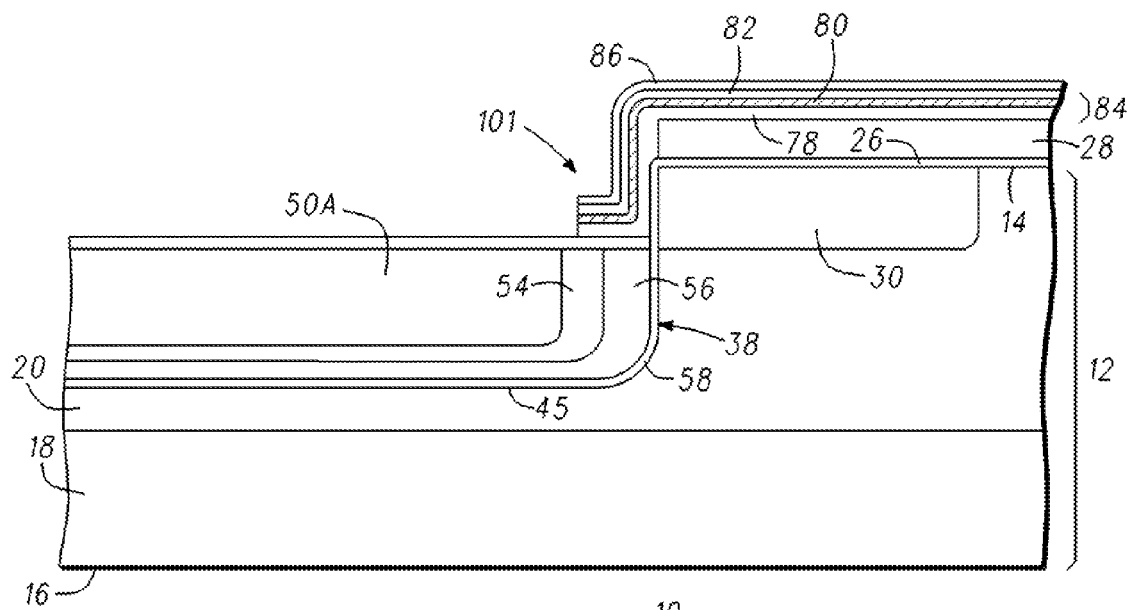
Figure 10:
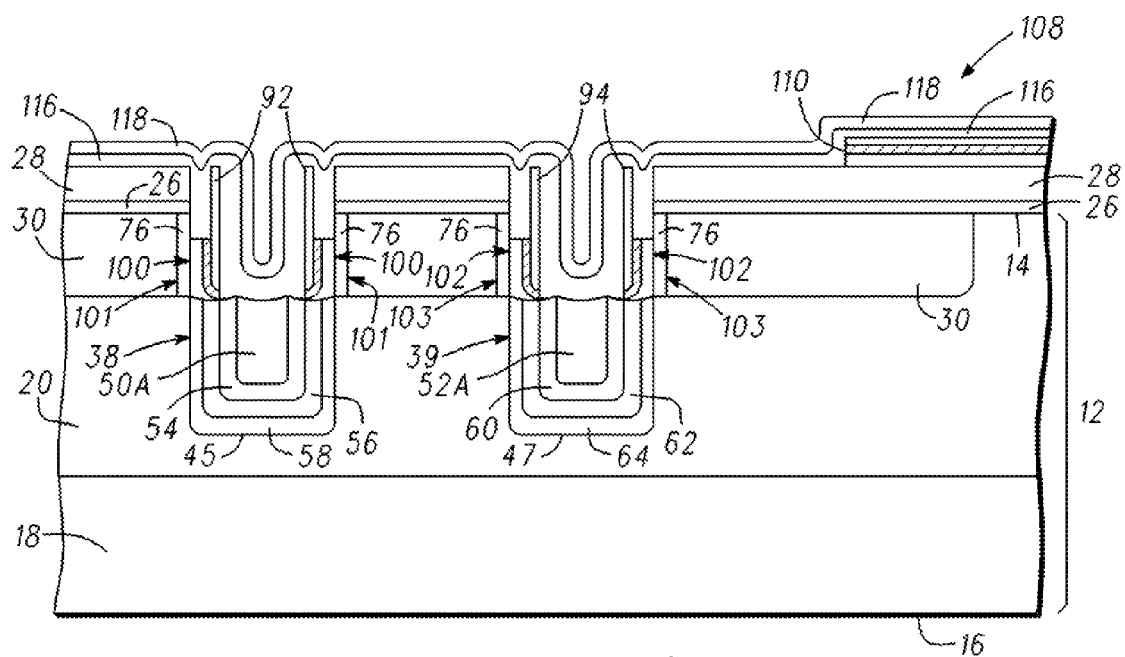
Figure 11:
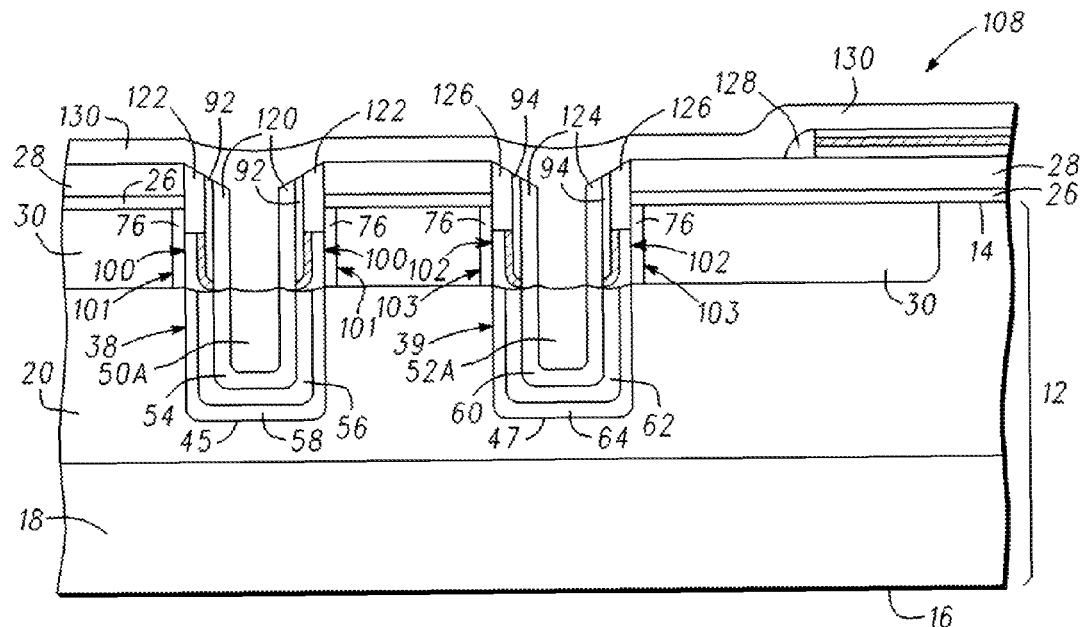
Figure 12:
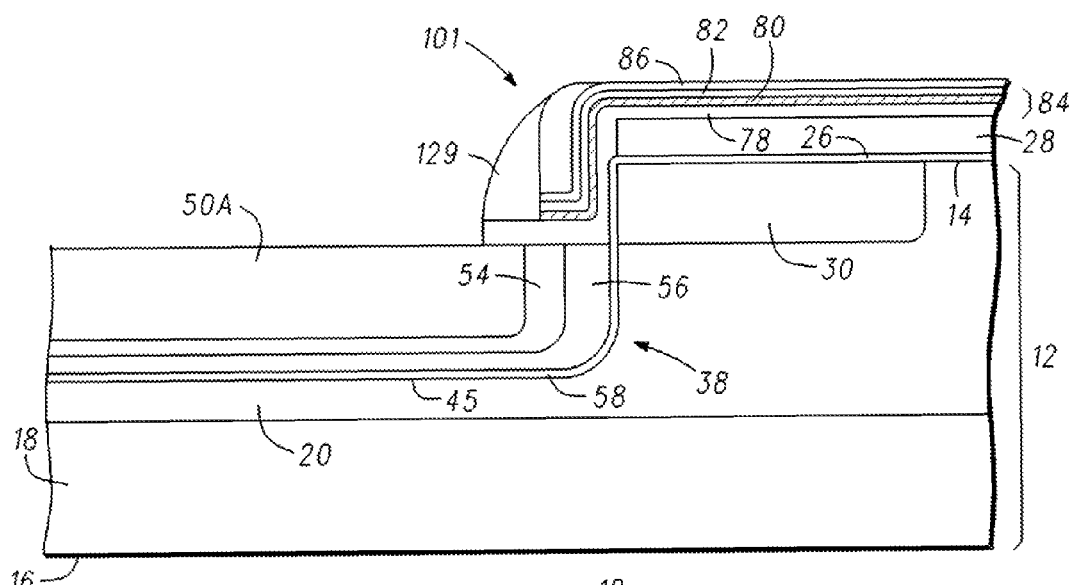
Figure 13:
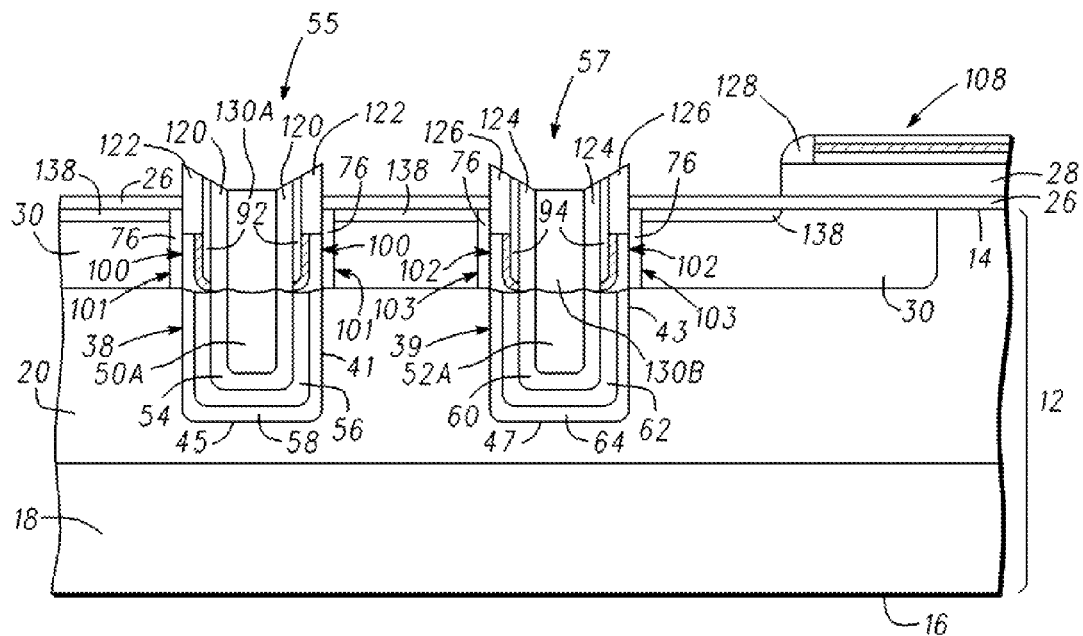
Figure 14:
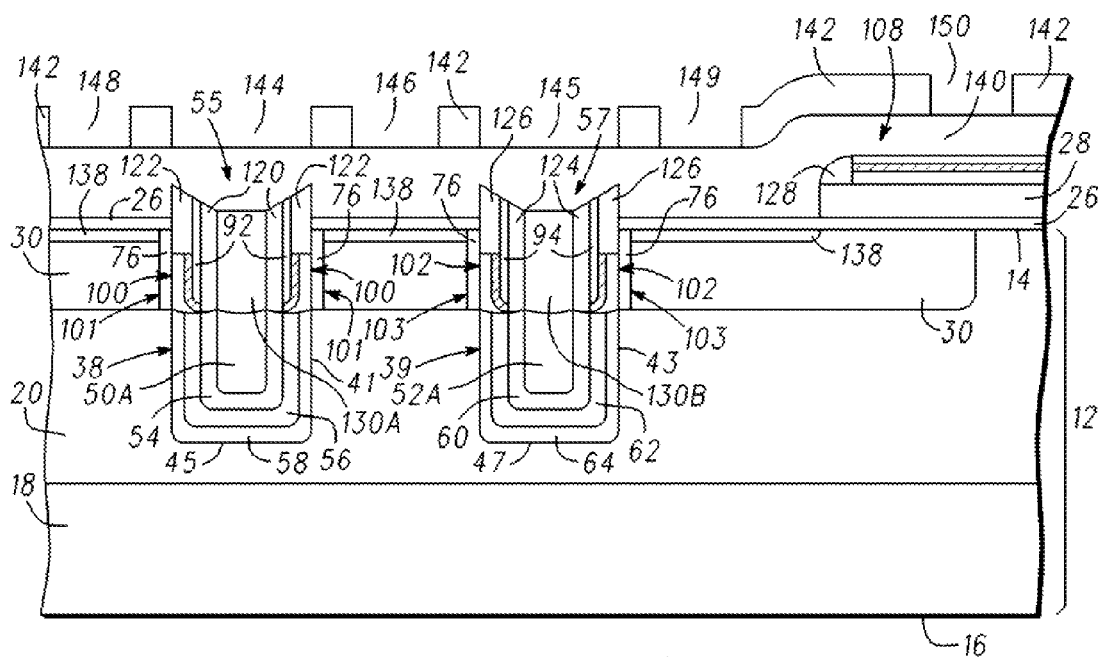
Figure 15:
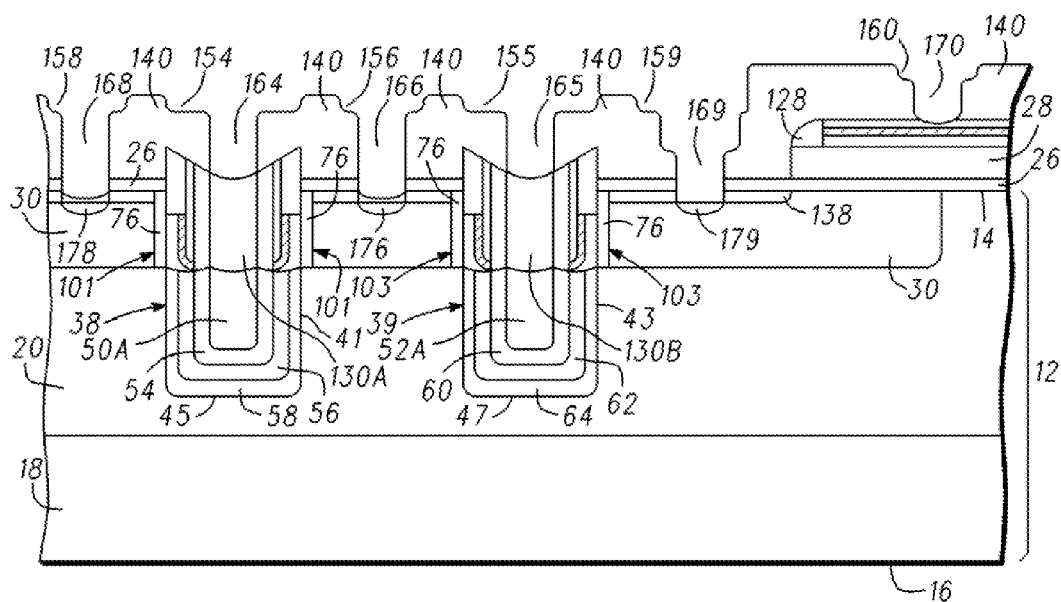
Figure 16:
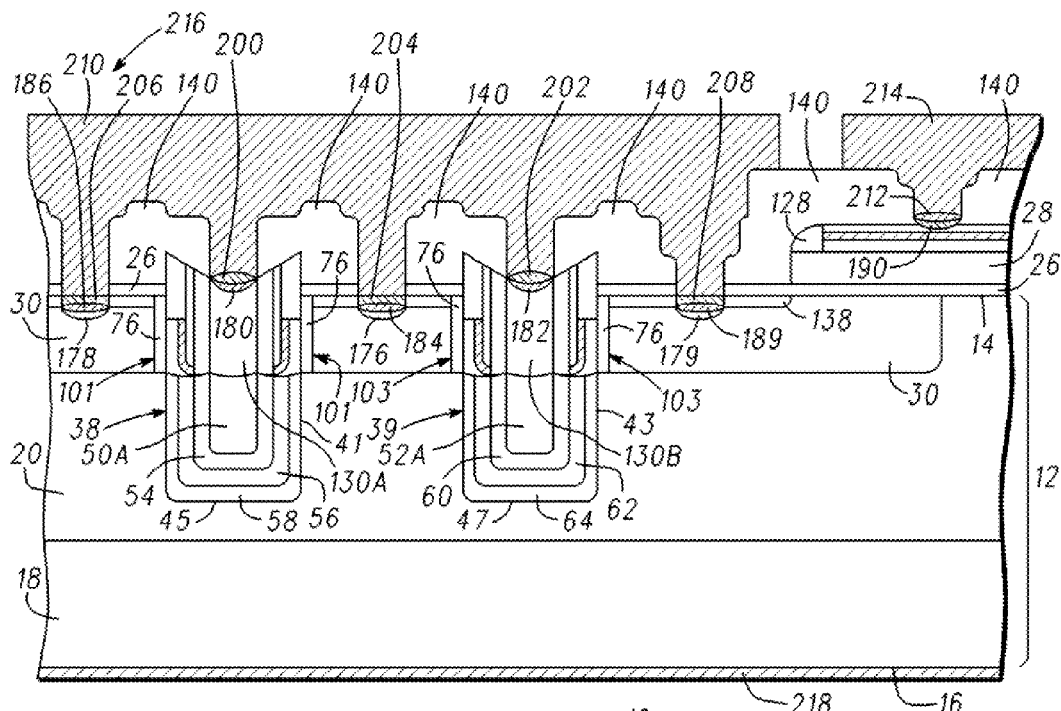

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a cross-sectional view of the semiconductor component of FIG. 4 at a later stage of manufacture;

FIG. 6 is a cross-sectional view of the semiconductor component of FIG. 5 at a later stage of manufacture;

FIG. 7 is a cross-sectional view of the semiconductor component of FIG. 6 at a later stage of manufacture;

FIG. 8 is a cross-sectional view of the semiconductor component of FIG. 7 at a later stage of manufacture;

FIG. 9 is a longitudinal cross-sectional view of the semiconductor component of FIG. 8;

FIG. 10 is a cross-sectional view of the semiconductor component of FIG. 9 at a later stage of manufacture;

FIG. 11 is a cross-sectional view of the semiconductor component of FIG. 10 at a later stage of manufacture;

FIG. 12 is a longitudinal cross-sectional view of the semiconductor component of FIG. 11 at an earlier stage of manufacture;

FIG. 13 is a cross-sectional view of the semiconductor component of FIG. 12 at a later stage of manufacture;

FIG. 14 is a cross-sectional view of the semiconductor component of FIG. 13 at a later stage of manufacture;

FIG. 15 is a cross-sectional view of the semiconductor component of FIG. 14 at a later stage of manufacture; and FIG. 16 is a cross-sectional view of the semiconductor component of FIG. 15 at a later stage of manufacture.

DETAILED DESCRIPTION

Generally, the present invention provides a semiconductor component that includes a field plate and a semiconductor device such as a field effect transistor or a trench field effect transistor, a vertical power field effect transistor, a power field effect transistor, or combinations thereof. It should be noted that a power field effect transistor is also referred to as a vertical power device and a vertical field effect transistor is also referred to as a power device. In accordance with an embodiment, a semiconductor component includes at least one trench formed in a semiconductor material comprising a layer of epitaxial material disposed over a semiconductor substrate. The at least one trench has a first portion and a second portion, wherein a first portion of a field plate is manufactured in the first portion of the at least one trench and a second portion of a field plate is manufactured in the second portion of the at least one trench. A gate structure is manufactured in the second portion of the trench, wherein a gate oxide is fabricated from a portion of the epitaxial layer.

In accordance with another embodiment, a gate structure is manufactured in the second portion of the trench, wherein a gate oxide is fabricated from a portion of the epitaxial layer. A gate electrode is formed laterally adjacent to the gate oxide, wherein the gate electrode is spaced apart from the portions of the field plate in the first and second portions of the trench by a dielectric material.

Figure 1:
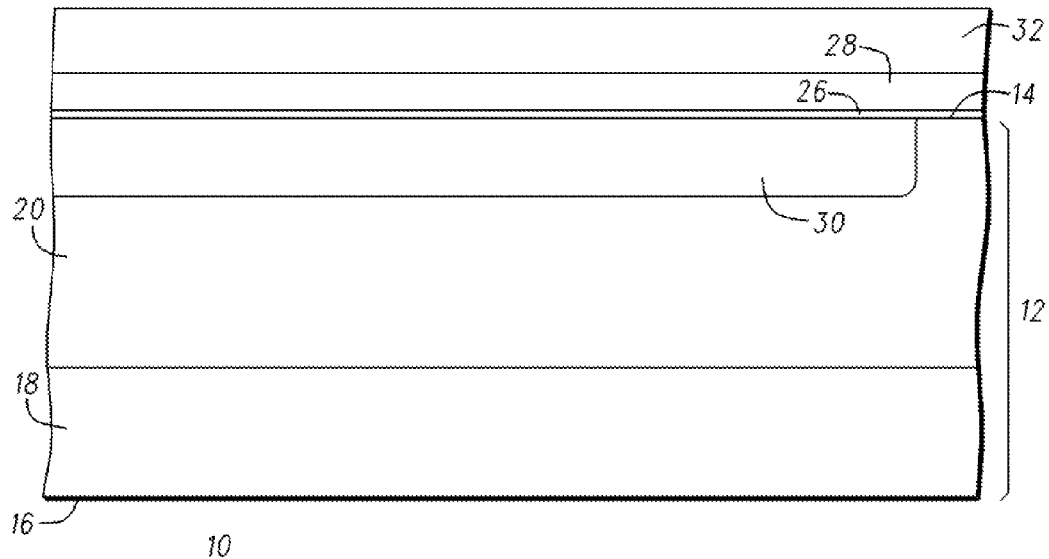
FIG. 1 is a cross-sectional view of a semiconductor component at an early stage of manufacture in accordance with an embodiment of the present invention.

FIG. 1 is a cross-sectional view of a portion of a semiconductor component 10 during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with an embodiment, semiconductor material 12 comprises an epitaxial layer 20 that is disposed on a semiconductor substrate 18. Preferably, substrate 18 is silicon that is heavily doped with an N-type dopant or impurity material and epitaxial layer 20 is silicon lightly doped with an N-type dopant. The resistivity of substrate layer 18 may be less than about 0.01 Ohm-centimeters ("Ω-cm") and the resistivity of epitaxial layer 20 may be greater than about 0.1 Ω-cm. Substrate layer 18 provides a low resistance conduction path for the current that flows through a power transistor and a low resistance electrical connection to a bottom drain conductor that is formed on bottom surface 16 of semiconductor material 12, a top drain conductor, or both. A region or layer doped with an N-type dopant is referred to as a region having an N-type conductivity or an N conductivity type and a region or layer doped with a P-type dopant is referred to as a region having a P-type conductivity or a P conductivity type.

A layer of dielectric material 26 is formed on or from epitaxial layer 20. In accordance with an embodiment, the material of dielectric layer 26 is silicon dioxide having a thickness ranging from about 200 Angstroms (Å) to about 1,000 Å. Techniques for forming silicon dioxide layer 26 are known to those skilled in the art. An implant mask (not shown) is formed on dielectric layer 26. By way of example, the implant mask is photoresist having openings that expose portions of dielectric layer 26. A P-type conductivity dopant layer (not shown) is formed in epitaxial layer 20. The dopant layer may be formed by implanting an impurity material such as, for example, boron into epitaxial layer 26. The boron may be implanted at a dose ranging from about $1\times10^{13}$ ions per centimeter squared (ions/cm$^2$) to about $1\times10^{14}$ ions/cm$^2$ and an implant energy ranging from about 100 kilo electron volts (keV) to about 400 keV. The technique for forming the dopant layer is not limited to an implantation technique. The masking structure is removed.

A protective layer 28 is formed on dielectric layer 26. Protective layer 28 may be silicon nitride having a thickness ranging from about 500 Å to about 2,000 Å. In accordance with an embodiment, dielectric layer 26 has a thickness of about 300 Å and protective layer 28 has a thickness of about 1,000 Å. Preferably, the materials of layers 26 and 28 are selected so that protective layer 28 restricts oxygen diffusion and therefore protects underlying layers from oxidation. Although protective layer 28 is shown as a single layer of material, it can also be a multi-layered structure of different material types. Epitaxial layer 20 is annealed by heating to a temperature ranging from about 1,000 Degrees Celsius (° C.) to about 1,200° C. Annealing epitaxial layer 20 drives in the impurity material of the dopant layer to create a doped region 30. A layer of semiconductor material 32 having a thickness ranging from about 1,000 Å to about 5,000 Å is formed on protective layer 28. By way of example the semiconductor material of layer 32 is polysilicon having a thickness of about 3,000 Å.

Referring now to FIG. 2, a layer of photoresist is patterned over polysilicon layer 32 to form a masking structure 34 having openings 36 that expose portions of polysilicon layer 32. Masking structure 34 is also referred to as a mask. Trenches 38 and 39 having sidewalls 41 and 43, and floors 45 and 47, respectively, are formed in epitaxial layer 20 by removing the exposed portions of polysilicon layer 32, the portions of protective layer 28 and dielectric layer 26 below the exposed portions of polysilicon layer 32, and portions of epitaxial layer 20 below the exposed portions of polysilicon layer 32. These portions of layers 32, 28, 26, and 20 may be removed using an anisotropic etch technique such as, for example, reactive ion etching. Although trenches 38 and 39 are shown as ending in epitaxial layer 20, this is not a limitation of the present invention. For example, trenches 38 and 39 may extend into substrate 18. The etching technique and the number of trenches formed in epitaxial layer 20 are not limitations of the present invention. Masking structure 34 is removed.

Referring now to FIG. 3, a sacrificial layer of dielectric material 40 having a thickness ranging from about 250 Å to about 1,250 Å is formed on polysilicon layer 32, and along sidewalls 41 and 43 and floors 45 and 47 of the respective trenches 38 and 39. A layer of dielectric material 42 having a thickness ranging from about 5,000 Å to about 15,000 Å is formed on sacrificial layer 40. Thus, dielectric material 42 is formed laterally adjacent to sidewalls 41 and 43 and vertically adjacent to floors 45 and 47. Dielectric layer 42 may be formed or deposited by decomposition of tetraethylorthosilicate. A dielectric layer formed in this fashion is also referred to as a TEOS layer. Dielectric layer 42 is annealed by heating to a temperature ranging from about 500° C. to about 1,500° C. A layer of dielectric material 44 such as, for example, a TEOS layer, having a thickness ranging from about 5,000 Å to about 15,000 Å is formed on dielectric layer 42. Like dielectric layer 42, dielectric layer 44 is formed laterally adjacent to sidewalls 41 and 43 and vertically adjacent to floors 45 and 47. A doped layer of semiconductor material 46 such as, for example, polysilicon having a dopant or impurity material concentration ranging from about $1\times10^{19}$ atoms per cubic centimeter (atoms/cm$^3$) to about $5\times10^{20}$ atoms/cm$^3$ and a thickness ranging from about 5,000 Å to about 15,000 Å is formed on dielectric layer 44. In accordance with an embodiment of the present invention, sacrificial layer 40 has a thickness of about 670 Å, dielectric layers 42 and 44 each have thicknesses of about 1,000 Å, and polysilicon layer 46 has a thickness of about 8,000 Å and is doped with an impurity material of N-type conductivity having a concentration of about $1\times10^{20}$ atoms/cm$^3$. Thus, semiconductor layer 46 is between the dielectric material that is adjacent to sidewalls 41 and 43 of trenches 38 and 39.

Referring now to FIG. 4, polysilicon layer 46 is etched using a blanket polysilicon etchback process, leaving portions 50 and 52 of polysilicon layer 46 in trenches 38 and 39, respectively.

Referring now to FIG. 5, dielectric layers 44, 42, and 40 are anisotropically etched using, for example, a reactive ion etch to expose the remaining portions of polysilicon layer 32. After the reactive ion etch, portions 54, 56, and 58 of dielectric layers 44, 42, and 40, respectively, remain in trench 38 and portions 60, 62, and 64 of dielectric layers 44, 42, and 40, respectively, remain in trench 39. Thus, anisotropically etching dielectric layers 44, 42, and 40 removes sub-portions of the dielectric layers 44, 42, and 40.

Referring now to FIG. 6, portions 50 and 52 of polysilicon layer 46 and the remaining portions of polysilicon layer 32, i.e., the exposed portions of polysilicon layer 32, are removed using, for example, an anisotropic reactive ion etch. After the anisotropic reactive ion etch, sub-portions 50A and 52A of polysilicon portions 50 and 52 remain in trenches 38 and 39, respectively, and portions 70 and 72 of epitaxial layer 20 that are adjacent to trenches 38 and 39 are exposed.

Referring now to FIG. 7, a sacrificial oxide layer (not shown) having a thickness ranging from about 200 Å to about 500 Å is formed on protective layer 28, dielectric portions 54-58 and 60-64, the exposed portions 70 and 72 of epitaxial layer 20, and sub-portions 50A and 52A of polysilicon portions 50 and 52. The sacrificial oxide layer is removed using, for example, an etching solution comprising ten parts hydrofluoric acid to one part water. Removing the sacrificial oxide layer exposes portions 70 and 72 of epitaxial layer 20. Layers of dielectric material 76 having a thickness ranging from about 100 Å to about 2,500 Å are formed from exposed portions 70 and 72 of epitaxial layer 20 that include portions of sidewalls 41 and 43. Thus layers of dielectric material 76 are formed from portions of sidewalls 41 and 43. In accordance with an embodiment of the present invention, dielectric layers 76 are oxide layers that serve as a gate oxide for semiconductor component 10. An electrically conductive material such as, for example, a doped layer of semiconductor material 78 having a dopant or impurity material concentration ranging from about $1 \times 10^{19}$ atoms/cm$^3$ to about $5 \times 10^{20}$ atoms/cm$^3$ and a thickness ranging from about 1,000 Å to about 8,000 Å, is formed on gate oxide 76 and the exposed portions of dielectric portions 54-58 and 60-64 and protective layer 28. In accordance with an embodiment of the present invention, conductive layer 78 is polysilicon layer having a thickness of about 3,500 Å and an impurity material concentration of about $1 \times 10^{20}$ atoms/cm$^3$ Optionally, a layer of refractory metal 80 such as, for example, tungsten or tungsten silicide is conformally deposited over polysilicon layer 78. It should be understood that the type of silicide is not a limitation of the present invention. For example, other suitable silicides include titanium silicide (TiSi), platinum silicide (PtSi), cobalt silicide (CoSi$_2$), or the like. A doped layer of polysilicon 82 having a thickness ranging from about 500 Å to about 1,000 Å and a dopant concentration ranging from about $1 \times 10^{19}$ atoms/cm$^3$ to about $2 \times 10^{20}$ atoms/cm$^3$ is formed on tungsten silicide layer 80. Polysilicon layer 78, silicide layer 80, and polysilicon layer 82 are referred to as a conductive layer 84 or a gate connect structure.

A layer of dielectric material 86 having a thickness ranging from about 500 Å to about 1,500 Å is formed on conductive layer 84. By way of example, dielectric layer 86 is silicon dioxide having a thickness of about 670 Å formed by the wet oxidation of polysilicon layer 82 of conductive layer 84. A layer of photoresist is patterned over oxide layer 86 to form a masking structure 88 having an opening 90 that exposes a portion of oxide layer 86. Masking structure 88 is also referred to as a mask.

Referring now to FIG. 8, the exposed portions of oxide layer 86 are anisotropically etched and the portions of conductive layer 84 below the exposed portions of oxide layer 86 are anisotropically etched using, for example, a reactive ion etch to re-open portions of trenches 38 and 39. After the anisotropic etch, portions 92 and 94 of oxide layer 86 remain in trenches 38 and 39, portions 100 and 102 of conductive layer 84 remain between oxide portions 92 and 94 and gate oxide 76 respectively, gaps 104 and 106 are formed over conductive layer portions 100 and 102, between oxide portion 92 and gate oxide 76, and between oxide portion 94 and gate oxide 76. Portion 108 of conductive layer 84 remains over a portion of protection layer 28. Portion 108 has a sidewall 110 and serves as a gate contact portion of semiconductor component 10. Masking structure 88 is removed. Portions 92 and 94 serve as dielectric barriers having opposing sides and portions 100 and 102 serve as gate conductors or gate electrodes. Gate oxide layer 76 and gate conductor 100 in trench 38 form a gate structure 101. Similarly, gate oxide layer 76 and gate conductor 102 in trench 39 form a gate structure 103.

FIG. 9 is a longitudinal cross-sectional view of FIG. 8 along the length of trench 38 and shows polysilicon portion 50A within trench 38 and a portion of gate structure 101. FIG. 9 also illustrates that gate electrode 101 is electrically connected to conductor 84.

Referring now to FIG. 10, a layer of dielectric material 116 having a thickness ranging from about 100 Å to about 1,000 Å is formed on dielectric barriers 92 and 94 of oxide layer 86, gate conductors 100 and 102, and conductive layer portions 50A and 52A and between dielectric barriers 92 and 94 and gate oxide 76 in trenches 38 and 39. A layer of dielectric material 118 such as, for example, a TEOS layer, having a thickness ranging from about 1,000 Å to about 5,000 Å is formed on dielectric layer 116. Dielectric layer 116 is also referred to as a pad oxide layer. By way of example, dielectric layer 116 has a thickness of about 300 Å and TEOS layer 118 has a thickness of about 2,400 Å.

Referring now to FIG. 11, dielectric layers 118 and 116 are anisotropically etched using, for example, a reactive ion etch to form spacers 120 adjacent portions 92 of oxide layer 86, spacers 122 in gaps 104 (shown in FIG. 8), spacers 124 adjacent portions 94 of oxide layer 86, spacers 126 in gaps 106 (shown in FIG. 8), and a spacer 128 adjacent sidewall 110. Spacers 120 and 124 are laterally adjacent to sides of dielectric barriers 92 and 94. In addition, spacers are formed at the ends of trenches 38 and 39. A spacer 129 is shown in FIG. 12. A doped layer of semiconductor material 130 such as, for example, polysilicon having a dopant or impurity material concentration ranging from about $1 \times 10^{19}$ atoms/cm$^3$ to about $5 \times 10^{20}$ atoms/cm$^3$ and a thickness ranging from about 1,000 Å to about 10,000 Å, is formed on the exposed portions of protective layer 28, gate contact portion 108 of conductive layer 84, spacer 128, and spacers 124 and 126. In accordance with an embodiment of the present invention, polysilicon layer 130 has a thickness of about 5,000 Å and an impurity material concentration of about $1 \times 10^{20}$ atoms/cm$^3$.

FIG. 12 is a longitudinal cross-sectional view of FIG. 11 before the formation of semiconductor layer 130. Like FIG. 9, the longitudinal cross-sectional view of FIG. 12 is taken along the length of trench 38 and shows polysilicon portion 50A within trench 38 and a portion of gate structure 101. FIG. 12 further illustrates an oxide spacer 129 that covers the portion of gate structure 101 near an end of trench 38. It should be noted that gate structure 103 in trench 39 has a similar structure as gate structure 101.

Referring now to FIG. 13, polysilicon layer 130 is anisotropically etched using, for example, a reactive ion etch, leaving doped polysilicon plugs 130A and 130B over portions 50A and 52A of conductive layer 84 in trenches 38 and 39, respectively. Plugs 130A and 130B are also referred to as conductive plugs. It should be noted that portions 50A and 130A cooperate to form a field plate 55 in trench 38 and portions 52A and 130B cooperate to form a field plate 57 in trench 39. It should be further noted that portions 50A and 52A are in the lower portions of trenches 38 and 39, respectively, and portions 130A and 130B are in the upper portions of trenches 38 and 39, respectively. Preferably, the exposed portions of protective layer 28 are removed using an anisotropic dry etch. Then, a doped layer 138 of N-type conductivity is formed in the portions of epitaxial layer 20 that are unprotected by protective layer 28, i.e., in the regions of epitaxial layer 20 underlying the portions of dielectric layer 26 from which protective layer 28 has been removed. In accordance with an embodiment, the doped layer is formed by implanting an impurity material of N-type conductivity such as, for example, phosphorus or arsenic at a dose ranging from about $1 \times 10^{14}$ atoms/cm$^2$ to about $5 \times 10^{16}$ atoms/cm$^2$ and an implant energy ranging from about 20 keV to about 500 keV to form source regions 138. Source regions 138 extend from surface 14 into epitaxial layer 20 a vertical distance that is less than the vertical distance that trenches 38 and 39 extend into epitaxial layer 20.

Referring now to FIG. 14, a layer of dielectric material 140 is formed over the exposed portions of dielectric layer 26, gate contact portion 108, spacer 128, and doped polysilicon plugs 130A and 130B. Dielectric layer 140 typically is referred to as an interlayer dielectric ("ILD0") layer. A layer of photoresist is formed on ILD0 layer 140 and patterned to a form masking structure 142 having openings 144 and 145 that expose portions of ILD0 layer 140 that are over polysilicon plugs 130A and 130B, an opening 146 that exposes a portion of ILD0 layer 140 that is between trenches 38 and 39, an opening 148 that exposes a portion of ILD0 layer 140 that is adjacent trench 38, an opening 149 that exposes a portion of ILD0 layer 140 that is between trench 39 and spacer 128, and an opening 150 that exposes a portion of ILD0 layer 140 that is over gate contact portion 108.

Referring now to FIG. 15, the portions of ILD0 layer 140 that are exposed by openings 144-146 and 148-150 are isotropically etched using a timed wet etch comprising, for example, a dilute hydrofluoric acid solution, to form tapered openings 154, 155, 156, 158, 159, and 160 in ILD0 layer 140. Portions of ILD0 layer 140 that are exposed by tapered openings 154-156 and 158-160 are anisotropically etched using for example, a reactive ion etch to form openings 164, 165, 166, 168, 169, and 170. Openings 164 and 165 extend into polysilicon plugs 130A and 130B, opening 166 extends into a portion of epitaxial layer 20 that is between trenches 38 and 39, opening 168 extends into a portion of epitaxial layer 20 that is adjacent to trench 38, opening 169 extends into a portion of epitaxial layer 20 that is between trench 39 and spacer 128, and an opening 170 extends into a subportion of gate contact portion 108. An impurity material of P-type conductivity such as, for example, boron or indium may be implanted into polysilicon plugs 130A and 130B, the exposed portions of epitaxial layer 20, and the exposed subportion of gate contact portion 108. The impurity material implanted through openings 166, 168, and 169 form contact enhancement regions 176, 178, and 179, respectively. By way of example, the impurity material is implanted at a dose ranging from about $1 \times 10^{14}$ atoms/cm$^2$ to about $5 \times 10^{16}$ atoms/cm$^2$ and an implant energy ranging from about 10 keV to about 100 keV. Masking structure 142 is removed and epitaxial layer 20 is annealed using a rapid thermal anneal technique.

Referring now to FIG. 16, a layer of refractory metal (not shown) is conformally deposited over polysilicon plugs 130A and 130B, the exposed portions of epitaxial layer 20, the exposed region of portion 108 of conductive layer 84, and over dielectric layer 140. By way of example, the refractory metal is titanium having a thickness ranging from about 100 Å to about 1,000 Å. The refractory metal is heated to a temperature ranging from about 350° C. to about 700° C. The heat treatment causes the titanium to react with the silicon to form titanium silicide in all regions in which the titanium is in contact with silicon or polysilicon. Thus, titanium silicide layers 180 and 182 are formed from polysilicon plugs 130A and 130B, a titanium silicide layer 184 is formed from the portion of epitaxial layer 20 between trenches 38 and 39, a titanium silicide layer 186 is formed from the portion of epitaxial layer 20 adjacent to contact enhancement region 178, a titanium silicide layer 189 is formed from the portion of epitaxial layer 20 adjacent to contact enhancement region 179, and a titanium silicide layer 190 is formed from the subportion of gate contact portion 108.

A barrier layer is formed in contact with titanium silicide layers 180, 182, 184, 186, 189, and 190 and over ILD layer 140. Suitable materials for the barrier layer include titanium nitride, titanium tungsten, or the like. A metal layer such as, for example, aluminum, is formed in contact with the barrier layer. A layer of photoresist (not shown) is formed on the metal layer and patterned to expose portions of the metal layer. The exposed portions of the metal layer and the portions of the barrier layer below the exposed portions of the metal layer are etched to form electrical conductors. More particularly, silicide layers 180, 182, 184, 186 and 189, and portions 200, 202, 204, 206, and 208 of the barrier layer, and a portion 210 of the metal layer cooperate to form a source contact and silicide layer 190, a portion 212 of the barrier layer, and another portion 214 of the metal layer cooperate to form a gate contact. The source contact and the field plate contact share a common metallization system and may be referred to as a source electrode or a contact structure 216. A conductor 218 is formed in contact with surface 16 and serves as a drain contact for power FET 10. Although a bottom-side drain contact is shown in FIG. 16, the present invention is not limited in this regard. For example, the drain electrode can be formed from the top side. Suitable metallization systems for conductor 218 include a gold alloy, titanium-nickel-gold, titanium-nickel-silver, or the like. It should be further understood that the type of semiconductor device manufactured from semiconductor material 12 is not limited to being a power FET or a trench FET.

Although certain preferred embodiments and methods have been disclosed herein, it will be apparent from the foregoing disclosure to those skilled in the art that variations and modifications of such embodiments and methods may be made without departing from the spirit and scope of the invention. For example, the masks or masking structures may be comprised of a single mask or masking structure with a plurality of openings formed therein or there may be a plurality of masks or masking structures spaced apart by one or more openings. In addition, the semiconductor devices may be vertical devices or lateral devices. It is intended that the invention shall be limited only to the extent required by the appended claims and the rules and principles of applicable law.

What is claimed is:

1. A method for manufacturing a semiconductor component, comprising:
    providing a first semiconductor material having first and second opposing surfaces;
    forming at least one trench in the first semiconductor material, the at least one trench having at least one sidewall and first and second trench regions, the second trench region between the first surface and the first trench region;
    forming a dielectric material in the at least one trench, the dielectric material extending from the second trench region to the first trench region;
    forming a second semiconductor material in the first trench region of the at least one trench, the dielectric material between the second semiconductor material and the at least one sidewall of the at least one trench, the second semiconductor material serving as a first portion of a field plate;
    removing a portion of the dielectric material from the second trench region of the at least one trench to expose a portion of the at least one sidewall;
    forming a gate structure within the second trench region of the at least one trench and adjacent to the exposed portion of the at least one sidewall; and
    forming a third semiconductor material within the second trench region of the at least one trench, the third semiconductor material electrically separated from the gate structure and electrically coupled to the second semiconductor material, the third semiconductor material serving as a second portion of the field plate.

2. The method of claim 1, wherein the at least one sidewall comprises first and second sidewalls, and wherein forming the dielectric material in the at least one trench includes forming a first portion of the dielectric material adjacent the first sidewall and forming a second portion of the dielectric material adjacent the second sidewall, and forming the second semiconductor material in the at least one trench includes forming the second semiconductor material between first and second portions of the dielectric material.

3. The method of claim 2, further including:
removing a portion of the second semiconductor material between the first and second portions of the dielectric material to form a first electrically conductive structure; and wherein removing a portion of the dielectric material from the second portion of the at least one trench to expose a portion of the at least one sidewall includes removing subportions of the first and second portions of the dielectric material.

4. The method of claim 3, further including:
forming dielectric material from portions of the first and second sidewalls of the at least one trench; and
forming a gate electrode adjacent the dielectric material formed from the first and second sidewalls of the at least one trench.

5. The method of claim 4, wherein forming the dielectric material includes oxidizing portions of the first semiconductor material exposed by the at least one trench and wherein forming the gate electrode includes depositing an electrically conductive material adjacent the dielectric material formed from the portions of the first and second sidewalls of the at least one trench.

6. The method of claim 1, further including forming a source region in a portion of the semiconductor material laterally adjacent the at least one trench.

7. The method of claim 1, wherein forming the gate structure within the second trench region of the at least one trench and adjacent to the exposed portion of the at least one sidewall includes:
forming dielectric material from or on the exposed portion of the at least one sidewall; and
forming a gate electrode adjacent the dielectric material formed from the exposed portion of the at least one sidewall.

8. The method of claim 1, wherein forming the second semiconductor material in the first trench region of the at least one trench includes forming a first polysilicon layer in the first trench region and forming the third semiconductor material in the second trench region of the at least one trench includes forming a second polysilicon layer in the second trench region.

9. A method for manufacturing a semiconductor component, comprising:
providing a first semiconductor material having first and second opposing surfaces;
forming at least one trench in the first semiconductor material, the at least one trench having first and second sidewalls;
forming a dielectric material in the at least one trench, a first portion of the dielectric material adjacent the first sidewall and a second portion of the dielectric material adjacent the second sidewall;
forming a second semiconductor material in the at least one trench, the dielectric material between the second semiconductor material and the at least one sidewall of the at least one trench and between first and second portions of the dielectric material;
removing a portion of the second semiconductor material between the first and second portions of the dielectric material to form a first electrically conductive structure;
forming a first portion of a gate structure within the at least one trench by:
removing subportions of the dielectric material;
forming dielectric material from portions of the first and second sidewalls of the at least one trench by oxidizing portions of the first semiconductor material exposed by the at least one trench; and
forming a gate electrode adjacent the dielectric material formed from the first and second sidewalls of the at least one trench by depositing an electrically conductive material adjacent the dielectric material formed from the portions of the first and second sidewalls of the at least one trench;
forming a third semiconductor material within the at least one trench, the third semiconductor material electrically separated from the gate structure; and
forming a layer of dielectric material over the electrically conductive material and removing portions of the layer of dielectric material to form first and second dielectric barriers that are laterally spaced apart from the first and second sidewalls of the at least one trench, wherein the first and second dielectric barriers have first and second sides;
removing a portion of the electrically conductive material between the first side of the first dielectric barrier and the first sidewall; and
removing a portion of the electrically conductive material between the first side of the second dielectric barrier and the second sidewall.

10. The method of claim 9, wherein the electrically conductive material comprises one of a doped layer of polysilicon or multi-layer structure comprising a silicide between first and second doped layers of polysilicon.

11. The method of claim 9, further including:
forming a first dielectric material between the first dielectric barrier and the first sidewall;
forming a second dielectric material between the second dielectric barrier and the second sidewall;
forming a third dielectric material laterally adjacent the second side of the first dielectric barrier; and
forming a fourth dielectric material laterally adjacent the second side of the second dielectric barrier.

12. The method of claim 11, further including forming an electrically conductive plug between the second sides of the first and second dielectric barriers and over the electrically conductive structure.

13. The method of claim 12, further including forming a doped region in a portion of the first semiconductor material adjacent the first surface.

14. The method of claim 12, further including forming a contact structure to the electrically conductive plug.

15. A method for manufacturing a semiconductor component, comprising:
providing a semiconductor substrate of a first conductivity type;
forming an epitaxial layer of the first conductivity type and a first resistivity over the semiconductor substrate, the epitaxial layer having a major surface;
forming a trench in the epitaxial layer, the trench having first and second sidewalls and a second trench region over a first trench region, wherein the first and second sidewalls extend into the first and second trench regions;
forming a first layer of dielectric material in the first and second trench regions;
forming a first portion of a field plate in the first trench region;

removing portions of the first layer of dielectric material to expose portions of the first and second sidewalls in the second trench region and portions of the epitaxial layer adjacent to the second trench region, wherein the portions of the first layer of dielectric material on the first and second sidewalls in the first trench region remain;

forming a gate dielectric adjacent the exposed portion of the first sidewall of the second trench region and from a the exposed portion of the epitaxial layer;

forming a gate electrode in the second trench region, the gate electrode adjacent the gate dielectric;

forming a dielectric material adjacent the gate electrode; and forming a conductive plug in the second trench region, the conductive plug serving as a second portion of the field plate, electrically coupled to the first portion of the field plate, and electrically isolated from the gate electrode.

16. The method of claim 15, wherein forming the first portion of the field plate in the first region includes forming a dielectric material adjacent the first and second sidewalls and forming the first portion of the field plate adjacent the dielectric material, wherein the dielectric material electrically isolates the field plate from the first and second sidewalls.

17. The method of claim 16, further including forming a doped region in the epitaxial layer, the doped region extending from the surface into the epitaxial layer a distance that is less than a distance the trench extends into the epitaxial layer.

18. The method of claim 17, further including forming a gate connect structure over the epitaxial layer.

19. The method of claim 18, wherein the gate connect structure comprises one of a layer of doped polysilicon or a multi-layer structure having a silicide layer between a plurality of doped polysilicon layers.

20. The method of claim 17, further including:

forming a layer of dielectric material over the epitaxial layer and the trench;

forming an opening in the layer of dielectric material that is over the epitaxial layer to expose the conductive plug in the second trench region; and forming a contact to the conductive plug in the second trench region.

\* \* \* \* \*